US005644085A

United States Patent [19]

Lorraine et al.

[11] Patent Number: 5,644,085

[45] Date of Patent: Jul. 1, 1997

[54] HIGH DENSITY INTEGRATED ULTRASONIC PHASED ARRAY TRANSDUCER AND A METHOD FOR MAKING

[75] Inventors: Peter William Lorraine, Niskayuna; Venkat Subramaniam Venkataramani, Clifton Park, both of N.Y.

[73] Assignee: General Electric Company, Schenectady, N.Y.

[21] Appl. No.: 415,895

[22] Filed: Apr. 3, 1995

[51] Int. Cl.[6] ............................ H04R 17/00; H01L 41/08

[52] U.S. Cl. ........................... 73/641; 29/25.35; 310/325; 310/334; 367/140

[58] Field of Search .............................. 73/642, 625, 641, 73/628, 632; 29/25.35, 840; 310/334, 326, 327, 336, 365, 366, 367, 368; 367/153, 155

[56] References Cited

U.S. PATENT DOCUMENTS

| | | | |
|---|---|---|---|
| 4,434,384 | 2/1984 | Dunnrowicz et al. | 310/325 |
| 4,442,715 | 4/1984 | Brisken et al. | 73/626 |
| 4,611,372 | 9/1986 | Enjoji et al. | 29/25.35 |
| 4,747,192 | 5/1988 | Rokurota | 29/25.35 |
| 5,045,746 | 9/1991 | Wersing et al. | 310/334 |
| 5,267,221 | 11/1993 | Miller et al. | 367/140 |
| 5,311,095 | 5/1994 | Smith et al. | 310/334 |
| 5,329,498 | 7/1994 | Greenstein | 367/155 |

OTHER PUBLICATIONS

"Two Dimensional Array Transducer Using Hybrid Connection Technology" by Smith et al., 4 pages.

"Hybrid Linear and Matrix Acoustic Arrays" by Pappalardo, Ultrasonics, Mar. 1981, pp. 81–86.

"Marix Array Tranducer and Flexible Matrix Array Tranducer" by Kojima, 1986 Ultrasonics Symposium, pp. 649–654.

"Two Dimensional Arrays for Medical Ultrasound" by Smith, et al, Ultrasonic Imaging 14, 1992, pp. 213–233.

*Primary Examiner*—Hezron E. Williams

*Assistant Examiner*—Rose M. Finley

*Attorney, Agent, or Firm*—David C. Goldman; Marvin Snyder

[57] ABSTRACT

The present invention discloses a high density integrated ultrasonic phased array transducer and method for making. The high density integrated ultrasonic phased array includes a backfill material having an array of holes formed therein. Each of the holes are separated a predetermined distance apart from each other and have a predetermined hole depth. Each of the holes contain a conducting material deposited therein forming a high density interconnect with uniaxial conductivity. A piezoelectric ceramic material is bonded to the backfill material at a surface opposite the array of conducting holes. Matching layers are bonded to the piezoelectric ceramic material. The surface opposite the array of conducting holes is cut through a portion of the matching layers, the piezoelectric ceramic material, and the backfill material, forming an array of isolated individual elements each having multiple electrical connections therein.

20 Claims, 3 Drawing Sheets

| |
|---|
| FIG. 3A |
| FIG. 3B |
| FIG. 3C |
| FIG. 3D |
| FIG. 3E |
| FIG. 3F |
| FIG. 3G |

HIGH DENSITY INTEGRATED ULTRASONIC PHASED ARRAY TRANSDUCER AND A METHOD FOR MAKING

BACKGROUND OF THE INVENTION

The present invention relates generally to an ultrasonic phased array transducer and more particularly to a high density integrated ultrasonic phased array transducer having an uniaxially conducting backfill and a method for forming.

A typical ultrasonic phased array transducer used in medical and industrial applications includes one or more piezoelectric elements placed between a pair of electrodes. The electrodes are connected to a voltage source. When a voltage is applied, the piezoelectric elements are excited at a frequency corresponding to the applied voltage. As a result, the piezoelectric element emits an ultrasonic beam of energy into a media that it is coupled to at frequencies corresponding to the convolution of the transducer's electrical/acoustical transfer function and the excitation pulse. Conversely, when an echo of the ultrasonic beam strikes the piezoelectric elements, each element produces a corresponding voltage across its electrodes.

In addition, the ultrasonic phased array typically includes acoustic matching layers coupled to the piezoelectric elements. The acoustic matching layers transform the acoustic impedance of the patient or object to a value closer to that of the piezoelectric element. This improves the efficiency of sound transmission to the patient/object and increases the bandwidth over which sound energy is transmitted. Also, the ultrasonic phased array includes an acoustic backing layer (i.e., a backfill) coupled to the piezoelectric elements opposite to the acoustic matching layers. The backfill has a low impedance in order to direct the ultrasonic beam towards the patient/object. Typically, the backfill is made from a lossy material that provides high attenuation for diminishing reverberations.

In order to maintain electrical and acoustical isolation in the ultrasonic phased array transducer, the array of piezoelectric elements need to be separated with independent electrical connections. Typically, the piezoelectric elements are separated by using a dicing saw or by laser machining. Electrical connections made through the backfill layer must not interfere with the acoustic properties (i.e. high isolation, high attenuation, and backfill impedance). In certain applications such as 1.5 or 2 dimensional arrays, there is a very small profile which makes it extremely difficult to make electrical connections without interfering with the acoustic properties of the ultrasonic phased array.

One approach that has been used to overcome this interconnect problem is to bond wires or flexible circuit boards to the piezoelectric elements. However, these schemes are difficult to implement with very small piezoelectric elements or in 2 dimensional (2D) arrays, since backfill properties or acoustic isolation may be compromised. An example of a handwiring scheme that is not practicable for commercial manufacturing is disclosed in Kojima, *Matrix Array Transducer and Flexible Matrix Array Transducer,* IEEE ULTRASONICS, 1986, pp. 649–654. An example of another scheme that has been disclosed in Pappalardo, *Hybrid Linear and Matrix Acoustic Arrays,* ULTRASONICS, March 1981, pp. 81–86, is to stack individual lines of arrays of piezoelectric elements including the backfill. However, the scheme disclosed in Pappalardo is deficient because there is poor dimensional control. In Smith et al., *Two Dimensional Arrays for Medical Ultrasound,* ULTRASONIC IMAGING, Vol. 14, pp. 213–233 (1992), a scheme has been disclosed which uses epoxy wiring guides with conducting epoxy and wire conductors. However, the scheme disclosed in Smith et al. is deficient because it suffers from poor manufacturability and acoustic properties. Also, a three dimensional (3D) ceramic interconnect structure based multi-layer ceramic technology developed for semiconductor integrated circuits has been disclosed in Smith et al., *Two Dimensional Array Transducer Using Hybrid Connection Technology,* IEEE ULTRASONICS SYMPOSIUM, 1992, pp. 555–558. This scheme also suffers from poor manufacturability and acoustic properties.

SUMMARY OF THE INVENTION

Therefore, it is a primary objective of the present invention to provide a high density integrated ultrasonic phased array transducer that has high isolation between piezoelectric elements and a backfill with high attenuation and low impedance.

A second object of the present invention is to form electrical connections through a backfill layer of an ultrasonic phased array transducer with uniaxial conductivity.

Another object of the present invention is to pattern solder pads on the backfill layer for making flexible electrical connections to either cables, flexible circuit boards, or directly to integrated electronics.

Thus, in accordance with the present invention, there is provided a high density ultrasonic phased array transducer. The high density ultrasonic phased array transducer comprises a backfill material having an array of holes formed therein. Each of the holes are separated a predetermined distance apart from each other and have a predetermined hole depth. Each of the holes contain a conducting material deposited therein forming a high density interconnect with uniaxial conductivity. A piezoelectric ceramic material is bonded to the backfill material at a surface opposite the array of conducting holes. Matching layers are bonded to the piezoelectric ceramic material. The surface opposite the array of conducting holes is cut through a portion of the matching layers, the piezoelectric ceramic material, and the backfill material, forming an array of isolated individual elements each having multiple electrical connection therein.

In accordance with another embodiment of the present invention, there is provided a method for forming the high density ultrasonic phased array transducer. The method comprises forming a backfill material. An array of unidirectional holes are formed in the backfill material. Each of the holes are separated a predetermined distance apart from each other and have a predetermined depth within the backfill material. Conducting material is then deposited in the array of holes forming a high density interconnect with uniaxial conductivity. A piezoelectric ceramic material and matching layers are then bonded to the backfill material. The piezoelectric ceramic material and the matching layers are bonded to the backfill material on a surface opposite the array of conducting holes. At the surface opposite the array of conducting holes, a portion of the matching layers, the piezoelectric ceramic material, and the backfill material are cut forming an array of isolated individual elements each having multiple electrical connections therein.

While the present invention will hereinafter be described in connection with an illustrative embodiment and method of use, it will be understood that it is not intended to limit the invention to this embodiment. Instead, it is intended to cover all alternatives, modifications and equivalents as may be included within the spirit and scope of the present invention as defined by the appended claims.

DETAILED DESCRIPTION OF THE PRESENT INVENTION

Figure 1:
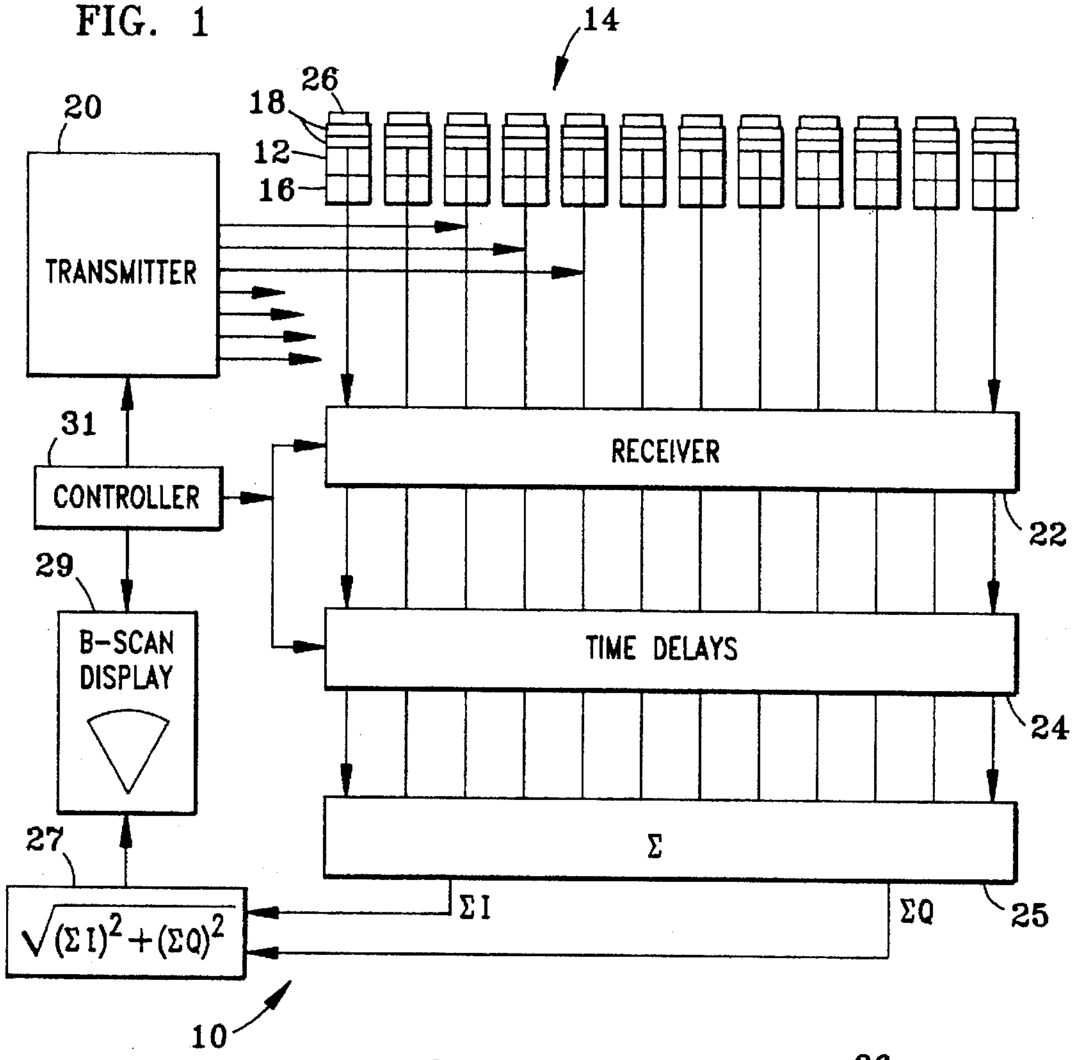
FIG. 1 is a schematic of a high density integrated ultrasonic phased array transducer and associated transmitter/receiver electronics according to the present invention.

FIG. 1 is a schematic of an ultrasonic phased array imager 10 which is used in medical and industrial applications. The imager 10 includes a plurality of piezoelectric elements 12 defining a phased array 14. The piezoelectric elements are preferably made from a piezoelectric material such as lead zirconium titanate (PZT) or a relaxor material such as lead magnesium niobate titanate and are separated to prevent cross-talk and have an isolation in excess of 20 decibels. A backfill layer 16 is coupled at one end of the phased array 14. The backfill layer 16 is highly attenuating and has low impedance for preventing ultrasonic energy from being transmitted or reflected from behind the piezoelectric elements 12 of the phased array 14. Backfill layers having fixed acoustical properties are well known in the art and are used to damp the ultrasonic energy transmitted from the piezoelectric elements 12. The backfill layer in the present invention is preferably made from a combination of hard particles in a soft matrix such as dense metal or metal oxides powder in silicone rubber and distributed through an epoxy matrix. Acoustic matching layers 18 are coupled to an end of the phased array 14 opposite from the backfill layer 16. The matching layers 18 provide suitable matching impedance to the ultrasonic energy as it passes between the piezoelectric elements 12 of the phased array 14 and the patient/object. In the illustrative embodiment, there are two matching layers preferably made from a polymer having an acoustic impedance ranging from about 1.8 Mrayls to about 2.5 Mrayls and a composite material having an acoustic impedance ranging from about 6 Mrayls to about 12 Mrayls.

A transmitter 20 controlled by a controller 31 applies a voltage to the plurality of piezoelectric elements 12 of the phased array 14. A beam of ultrasonic beam energy is generated and propagated along an axis through the matching layers 18 and a lens 26. The matching layers 18 broaden the bandwidth (i.e., damping the beam quickly) of the beam and the lens 26 directs the beam to a patient/object. The backfill layer 16 prevents the ultrasonic energy from being transmitted or reflected from behind the piezoelectric elements 12 of the phased array 14. Echoes of the ultrasonic beam energy return from the patient/object, propagating through the lens 26 and the matching layers 18 to the PZT material of the piezoelectric elements 12. The echoes arrive at various time delays that are proportional to the distances from the ultrasonic phased array 14 to the patient/object causing the echoes. As the echoes of ultrasonic beam energy strike the piezoelectric elements, a voltage signal is generated and sent to a receiver 22. The voltage signals at the receiver 22 are delayed by an appropriate time delay at a time delay means 24 set by the controller 31. The delay signals are then summed at a summer 25 and a circuit 27. By appropriately selecting the delay times for all of the individual piezoelectric elements and summing the result, a coherent beam sum is formed. The coherent beam sum is then displayed on a B-scan display 29 that is controlled by the controller 31. A more detailed description of the electronics connected to the phased array is provided in U.S. Pat. No. 4,442,715, which is incorporated herein by reference.

Figure 2:
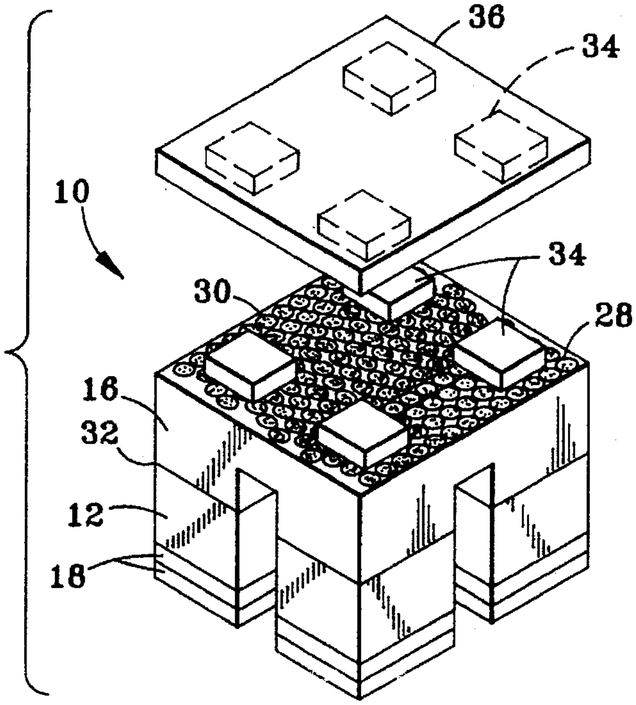
FIG. 2 is a schematic showing the high density integrated ultrasonic phased array transducer in further detail.

FIG. 2 is a schematic showing the high density integrated ultrasonic phased array transducer 14 in further detail. The high density integrated ultrasonic phased array 14 includes a backfill material 16 having an array of holes 28 formed therein. Each of the holes are separated a predetermined distance apart from each other and have a predetermined hole depth. Each of the holes contain a conducting material 30 deposited therein forming a high density interconnect with uniaxial conductivity. A surface 32 opposite the array of holes 28 on the backfill material 16 is metallized and bonded to a piezoelectric ceramic material 12. Two matching layers 18 are bonded to the piezoelectric ceramic material 12. The surface 32 opposite the array of conducting holes 28 is cut through a portion of the matching layers 18, the piezoelectric ceramic material 12, and the backfill material 16, forming an array of isolated individual elements each having multiple electrical connections therein. The high density integrated ultrasonic phased array transducer 14 may also include solder pads 34 patterned on the array of holes 28 and are used to bond electronics 36 such as cables, flexible circuit boards, or directly to integrated circuits.

Figure 3A:
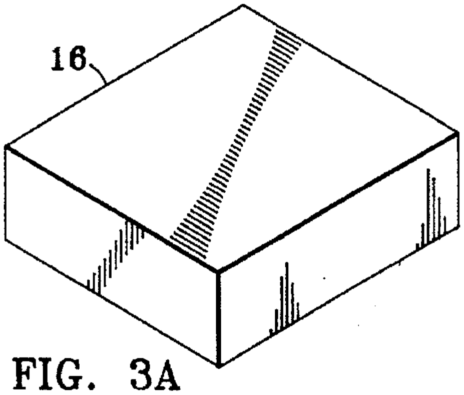
FIGS. 3A–3G illustrate a schematic method of forming the high density integrated ultrasonic phased array transducer.
Figure 3B:
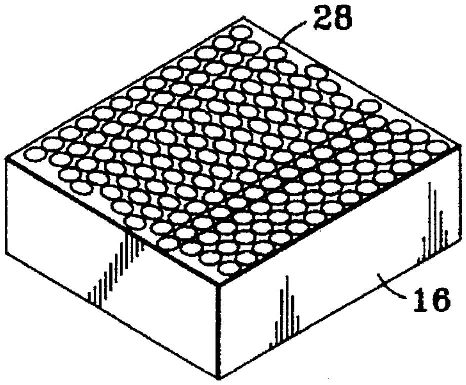
Figure 3C:
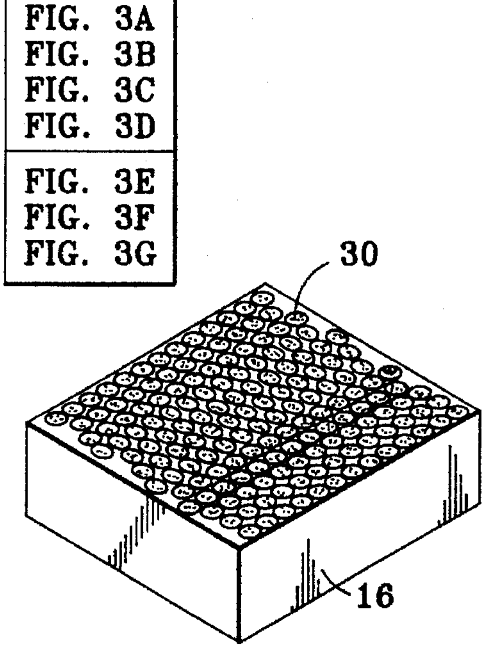

FIGS. 3A–3G illustrate a schematic method of fabricating the high density interconnect 16 and the phased array transducer 14. The specific processing conditions and dimensions serve to illustrate the present method but can be varied depending upon the materials used and the desired application and geometry of the phased array transducer. First, as shown in FIG. 3A, a rectangular slab of backfill material 34 such as epoxy loaded with particles of dense metal or metal oxide imbedded in silicone rubber is machined parallel at the sides to form a backfill layer. Then, in FIG. 3B, an array of holes 28 are formed in a planar section of the backfill layer 16. The array of holes 28 are formed in the surface of the backfill layer by laser machining or by molding a microcapillary array. The holes are separated from each other at a predetermined distance and in the present invention each of holes have a diameter of about 10 μm. Also, each of the holes have a depth extending through the thickness of the backfill layer so that there is low electrical resistance from the piezoelectric elements 12 to any attached electronics.

Once the array of holes 28 have been formed in the backfill layer, conducting material 30 is deposited in each of the holes (FIG. 3C) forming a high density interconnect with uniaxial conductivity. The conducting material is deposited in each of holes by flowing, electrodeless chemical deposition, chemical vapor deposition, or electroplating. In the present invention, the conducting material may be deposited metal such as copper, silver, gold, or a polymer.

Figure 3D:
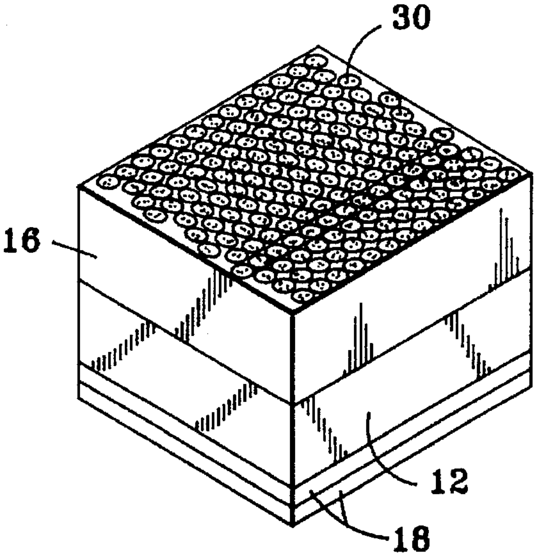
Figure 3E:
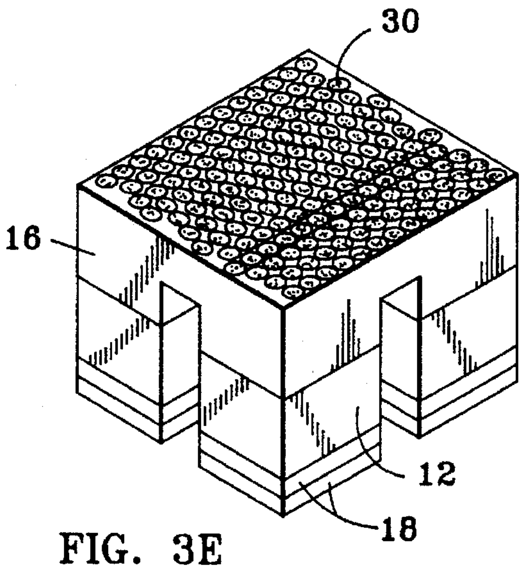
Figure 3F:
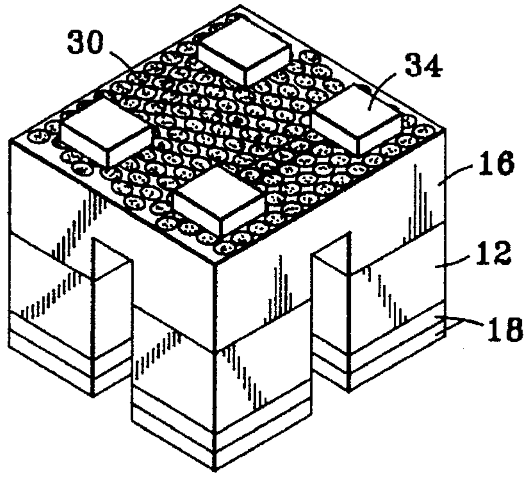
Figure 3G:
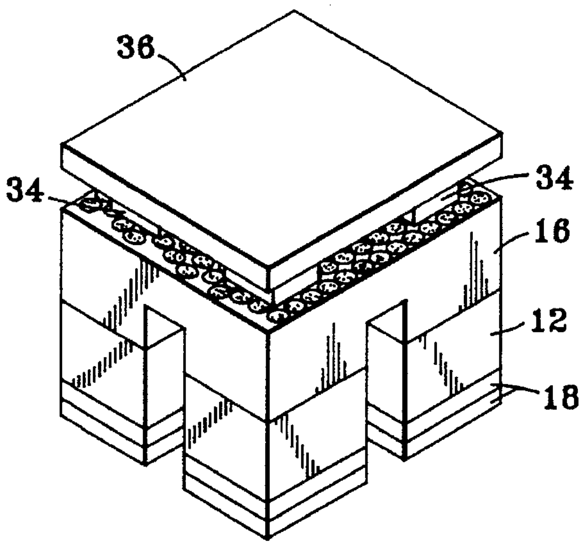

After the array of holes 28 have been deposited with a conducting material, the surface 32 opposite the array of conducting holes is metallized and bonded to the piezoelectric ceramic material 12 and the matching layers 18, as shown in FIG. 3D. In the illustrative embodiment, there are two matching layers used, however, more or less matching layers may be used. After the piezoelectric ceramic material 12 and the matching layers 18 have been bonded to the backfill layer, the phased array transducer is cut at the surface opposite the array of conducting holes through a portion of the matching layers, the piezoelectric ceramic material, and the backfill layer as shown in FIG. 3E. The cutting step is attained by using either a laser or a dicing saw. The result is a high density ultrasonic phased array transducer that is formed with an array of isolated individual elements each having multiple electrical connections therein. After the phased array transducer has been cut, the solder pads 34 are patterned on the structure in FIG. 3F for direct attachment of cables, flexible circuit boards, or integrated electronics 36 as shown in FIG. 3G. The high density integrated ultrasonic phased array transducer has high isolation between piezoelectric elements and a backfill with high attenuation and a impedance of about 4.5 MRayls.

It is therefore apparent that there has been provided in accordance with the present invention, a high density ultrasonic phased array transducer and method for making that fully satisfy the aims and advantages and objectives hereinbefore set forth. The invention has been described with reference to several embodiments, however, it will be appreciated that variations and modifications can be effected by a person of ordinary skill in the art without departing from the scope of the invention.

The invention claimed is:

1. A method for forming a high density ultrasonic phased array transducer, the method comprising the steps of:

forming a backfill material;

forming an array of unidirectional holes in the backfill material, each of the holes separated a predetermined distance apart from each other and having a predetermined depth within the backfill material;

depositing a conducting material in the array of holes forming a high density interconnect with uniaxial conductivity;

bonding a piezoelectric ceramic material and matching layers to the backfill material, the piezoelectric ceramic material and the matching layers bonding to the backfill material on a surface opposite the array of conducting holes; and cutting at the surface opposite the array of conducting holes through a portion of the matching layers, the piezoelectric ceramic material, and the backfill material, forming an array of isolated individual elements each having multiple electrical connections therein.

2. A method according to claim 1, wherein the backfill material comprises an epoxy loaded with particles of dense metal or metal oxide imbedded in silicone rubber.

3. A method according to claim 1, wherein each of the holes in the backfill have a diameter of about 10 μm.

4. A method according to claim 3, wherein the array of holes are formed from at least one of laser machining or direct molding.

5. A method according to claim 1, wherein the conducting material is deposited in the array of holes by one of flowing, electrodeless chemical deposition, chemical vapor deposition, or electroplating.

6. A method according to claim 1, further comprising the step of metallizing a surface opposite the array of conducting holes prior to bonding the piezoelectric ceramic material and the matching layers.

7. A method according to claim 1, wherein the step of cutting is made with at least one of a laser or a dicing saw.

8. A method according to claim 1, further comprising the step of patterning solder pads on the array of conducting holes.

9. A method according to claim 8, further comprising the step of attaching electronics to the solder pads.

10. A method for forming a high density ultrasonic phased array transducer, the method comprising the steps of:

forming a backfill material;

forming an array of unidirectional holes in the backfill material, each of the holes separated a predetermined distance apart from each other and having a predetermined depth within the backfill material;

depositing a conducting material in the array of holes forming a high density interconnect with uniaxial conductivity;

metallizing a surface opposite the array of conducting holes;

bonding a piezoelectric ceramic material and matching layers to the backfill material, the piezoelectric ceramic material and the matching layers bonding to the backfill material on the metallized surface;

cutting at the surface opposite the array of conducting holes through a portion of the matching layers, the piezoelectric ceramic material, and the backfill material, forming an array of isolated individual elements each having multiple electrical connections therein; and patterning solder pads on the array of conducting holes.

11. A method according to claim 10, wherein the backfill material comprises an epoxy loaded with particles of dense metal or metal oxide imbedded in silicone rubber.

12. A method according to claim 10, wherein each of the holes in the backfill have a diameter of about 10 μm.

13. A method according to claim 12, wherein the array of holes are formed by at least one of laser machining or direct molding.

14. A method according to claim 10, wherein the conducting material is deposited in the array of holes by one of flowing, electrodeless chemical deposition, chemical vapor deposition, or electroplating.

15. A method according to claim 10, wherein the step of cutting is made by at least one of a laser or a dicing saw.

16. A method according to claim 10, further comprising the step of attaching electronics to the solder pads.

17. A high density ultrasonic phased array transducer, comprising:

a backfill material having an array of holes formed therein, each of the holes separated a predetermined distance apart from each other and having a predetermined hole depth, each of the holes containing a conducting material deposited therein forming a high density interconnect with uniaxial conductivity; a piezoelectric ceramic material bonded to the backfill material at a surface opposite the array of conducting holes; and matching layers bonded to the piezoelectric ceramic material, the surface opposite the array of conducting holes having been cut through a portion of the matching layers, the piezoelectric ceramic material, and the backfill material, forming an array of isolated individual elements each having multiple electrical connections therein.

18. A high density ultrasonic phased array transducer according to claim 17, wherein the backfill material comprises an epoxy loaded with particles of dense metal or metal oxide imbedded in silicone rubber.

19. A high density ultrasonic phased array transducer according to claim 17, wherein each of the holes in the backfill have a diameter of about 10 μm.

20. A high density ultrasonic phased array transducer according to claim 17, further comprising solder pads patterned on the array of conducting holes for attaching electronics thereto.

* * * * *